United States Patent
Zeng et al.

(10) Patent No.: US 11,726,709 B2
(45) Date of Patent: Aug. 15, 2023

(54) MEMORY CONTROL METHOD, MEMORY STORAGE DEVICE AND MEMORY CONTROL CIRCUIT UNIT

(71) Applicant: PHISON ELECTRONICS CORP., Miaoli (TW)

(72) Inventors: Shih-Jia Zeng, Hsinchu (TW); Yu-Siang Yang, New Taipei (TW); Szu-Wei Chen, New Taipei (TW); Wei Lin, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 16/994,668

(22) Filed: Aug. 17, 2020

(65) Prior Publication Data
US 2022/0027089 A1    Jan. 27, 2022

(30) Foreign Application Priority Data

Jul. 23, 2020  (TW) .................................. 109124870

(51) Int. Cl.
G06F 3/06      (2006.01)
G11C 16/26    (2006.01)
G11C 16/04    (2006.01)

(52) U.S. Cl.
CPC .......... G06F 3/0659 (2013.01); G06F 3/0604 (2013.01); G06F 3/0679 (2013.01); G11C 16/26 (2013.01); G11C 16/0483 (2013.01)

(58) Field of Classification Search
CPC .... G06F 3/0659; G06F 3/0679; G06F 3/0604; G06F 3/0619; G06F 3/0634;
(Continued)

(56) References Cited

U.S. PATENT DOCUMENTS 10,175,892 B1 *  1/2019  Kim .................... G06F 3/0653
10,236,054 B1 *  3/2019  Jeon .................... G06F 11/1012
(Continued)

FOREIGN PATENT DOCUMENTS

CN      107092536      8/2017
CN      109426580      3/2019
(Continued)

OTHER PUBLICATIONS

"Computer Dictionary," 1994, Microsoft Press, 2nd Edition, p. 218, definition for "interface" (Year: 1994).*
(Continued)

*Primary Examiner* — Rocio Del Mar Perez-Velez
*Assistant Examiner* — Tong B. Vo
(74) *Attorney, Agent, or Firm* — JCIPRNET

(57) ABSTRACT

A memory control method, a memory storage device and a memory control circuit unit are provided. The method includes: determining a retry threshold value according to decoding history information which includes information related to at least one first decoding operation previously performed; and determining whether to enter a second decoding mode according to the retry threshold value after at least one second decoding operation performed based on a first decoding mode is failed. A decoding ability of the second decoding mode is higher than a decoding ability of the first decoding mode.

22 Claims, 9 Drawing Sheets

(58) Field of Classification Search
CPC ............ G06F 11/1012; G06F 2201/81; G06F 11/1402; G11C 16/26; G11C 16/0483; G11C 2029/0409; G11C 2029/0411; G11C 7/1006; G11C 29/021; G11C 29/028; G11C 29/70

See application file for complete search history.

(56) References Cited

U.S. PATENT DOCUMENTS

| | | | | |
|---|---|---|---|---|
| 2014/0281843 | A1* | 9/2014 | Lo | H04L 1/1896 714/807 |
| 2017/0024279 | A1* | 1/2017 | Lu | H03M 13/05 |
| 2017/0236592 | A1* | 8/2017 | Alhussien | G11C 7/1006 714/721 |
| 2018/0046542 | A1* | 2/2018 | Lin | G06F 11/1068 |
| 2018/0173447 | A1* | 6/2018 | Chin | G06F 3/0632 |
| 2019/0332472 | A1* | 10/2019 | Hong | G11C 29/52 |
| 2020/0133767 | A1* | 4/2020 | Yang | H03M 13/1111 |
| 2021/0149753 | A1* | 5/2021 | Tanakamaru | G06F 12/0284 |
| 2021/0265005 | A1* | 8/2021 | Kim | G11C 29/42 |

FOREIGN PATENT DOCUMENTS

| | | |
|---|---|---|
| CN | 111104044 | 5/2020 |
| TW | 201730893 | 9/2017 |

OTHER PUBLICATIONS

"Office Action of Taiwan Counterpart Application", dated Aug. 17, 2021, p. 1-p. 8.

"Office Action of China Counterpart Application", dated Jan. 24, 2022, p. 1-p. 9.

\* cited by examiner

MEMORY CONTROL METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 109124870, filed on Jul. 23, 2020. The entirety of the above-mentioned patent application is hereby incorporated by reference herein and made a part of this specification.

BACKGROUND

1. Technology Field

The invention relates to a memory control technique, and more particularly, to a memory control method, a memory storage device and a memory control circuit unit.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

As available time increases and/or temperature changes in the rewritable non-volatile memory module, memory cells in the rewritable non-volatile memory module may experience voltage shifts, which increase the number of error bits in the stored data. In general, a memory controller can first perform a hard decoding on data read from the rewritable non-volatile memory module in an attempt to quickly correct errors in the read data. If the hard decoding is failed, a soft decoding can be used instead to decode with more auxiliary information in an attempt to increase a decoding success rate. However, in some cases, the memory controller often spends too much time performing the hard decoding (including adjusting a read voltage level) instead of quickly starting the soft decoding, resulting in a low decoding efficiency for data with higher error rates. Nonetheless, if the hard decoding is skipped and the soft decoding is executed directly, system resources may be wasted.

SUMMARY

The invention provides a memory control method, a memory storage device and a memory control circuit unit, which are capable of achieving a balance between a data decoding speed and the decoding success rate.

An exemplary embodiment of the invention provides a memory control method for a rewritable non-volatile memory module. The memory control method includes: determining a retry threshold value according to decoding history information which includes information related to at least one first decoding operation previously performed; and determining whether to enter a second decoding mode according to the retry threshold value after at least one second decoding operation performed based on a first decoding mode is failed A decoding ability of the second decoding mode is higher than a decoding ability of the first decoding mode.

An exemplary embodiment of the invention further provides a memory storage device, which includes a connection interface unit, a rewritable non-volatile memory module and a memory control circuit unit. The connection interface unit is configured to couple to a host system. The memory control circuit unit is coupled to the connection interface unit and the rewritable non-volatile memory module. The memory control circuit unit is configured to determine a retry threshold value according to decoding history information. The decoding history information includes the information related to the at least one first decoding operation previously performed. The memory control circuit unit is further configured to determine whether to enter a second decoding mode according to the retry threshold value after at least one second decoding operation performed based on a first decoding mode is failed. A decoding ability of the second decoding mode is higher than a decoding ability of the first decoding mode.

An exemplary embodiment of the invention further provides a memory control circuit unit, which is configured to control a memory storage device. The memory storage device includes a rewritable non-volatile memory module. The memory control circuit unit includes a host interface, a memory interface, a decoding circuit and a memory management circuit. The host interface is configured to couple to a host system. The memory interface is configured to couple to the rewritable non-volatile memory module. The memory management circuit is coupled to the host interface, the memory interface and the decoding circuit. The memory management circuit is configured to determine a retry threshold value according to decoding history information. The decoding history information includes information related to at least one first decoding operation previously performed by the decoding circuit. The memory management circuit is further configured to determine whether to enter a second decoding mode according to the retry threshold value after at least one second decoding operation performed based on a first decoding mode by the decoding circuit is failed. A decoding ability of the second decoding mode is higher than a decoding ability of the first decoding mode.

An exemplary embodiment of the invention further provides a memory storage device, which includes a connection interface unit, a rewritable non-volatile memory module and a memory control circuit unit. The connection interface unit is configured to couple to a host system. The memory control circuit unit is coupled to the connection interface unit and the rewritable non-volatile memory module. The memory control circuit unit is configured to determine a retry threshold value as a first value and determine whether to enter a second decoding mode according to the first value after at least one third decoding mode performed based on a first decoding mode is failed. The memory control circuit unit is further configured to determine the retry threshold value as a second value and determine whether to enter the second decoding mode according to the second value after at least one fourth decoding mode performed based on the first decoding mode is failed. The first value is different from the second value. A decoding ability of the second decoding mode is higher than a decoding ability of the first decoding mode.

Based on the above, the retry threshold value can be determined according to the decoding history information. The decoding history information includes the information related to the at least one first decoding operation previously performed. Whether to enter the second decoding mode with higher decoding ability can be determined according to the retry threshold value after the at least one second decoding operation performed based on the first decoding mode is failed. In this way, the balance between the data decoding speed and the decoding success rate can be achieved.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

DESCRIPTION OF THE EMBODIMENTS

Figure 1:
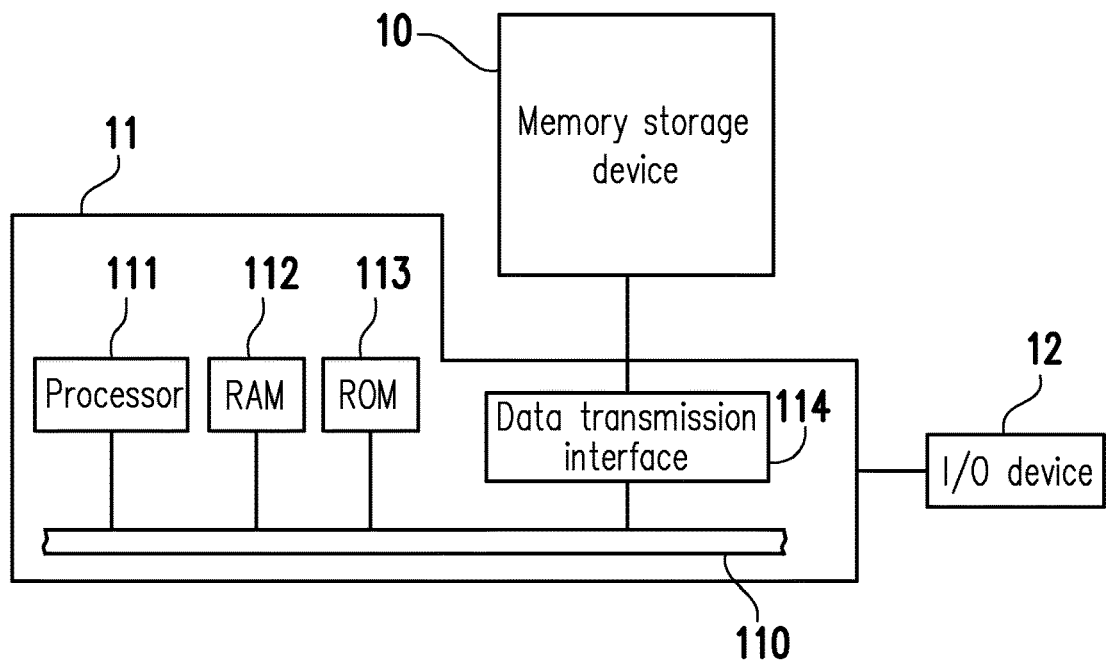
FIG. 1 is a schematic diagram illustrating a host system, a memory storage device and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the invention may comprise any one or more of the novel features described herein, including in the detailed description, and/or shown in the drawings. As used herein, "at least one," "one or more," and "and/or" are open-ended expressions that are both conjunctive and disjunctive in operation. For instance, each of the expressions "at least on of A, B and C," "at least one of A, B, or C," "one or more of A, B, and C," "one or more of A, B, or C," and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 2:
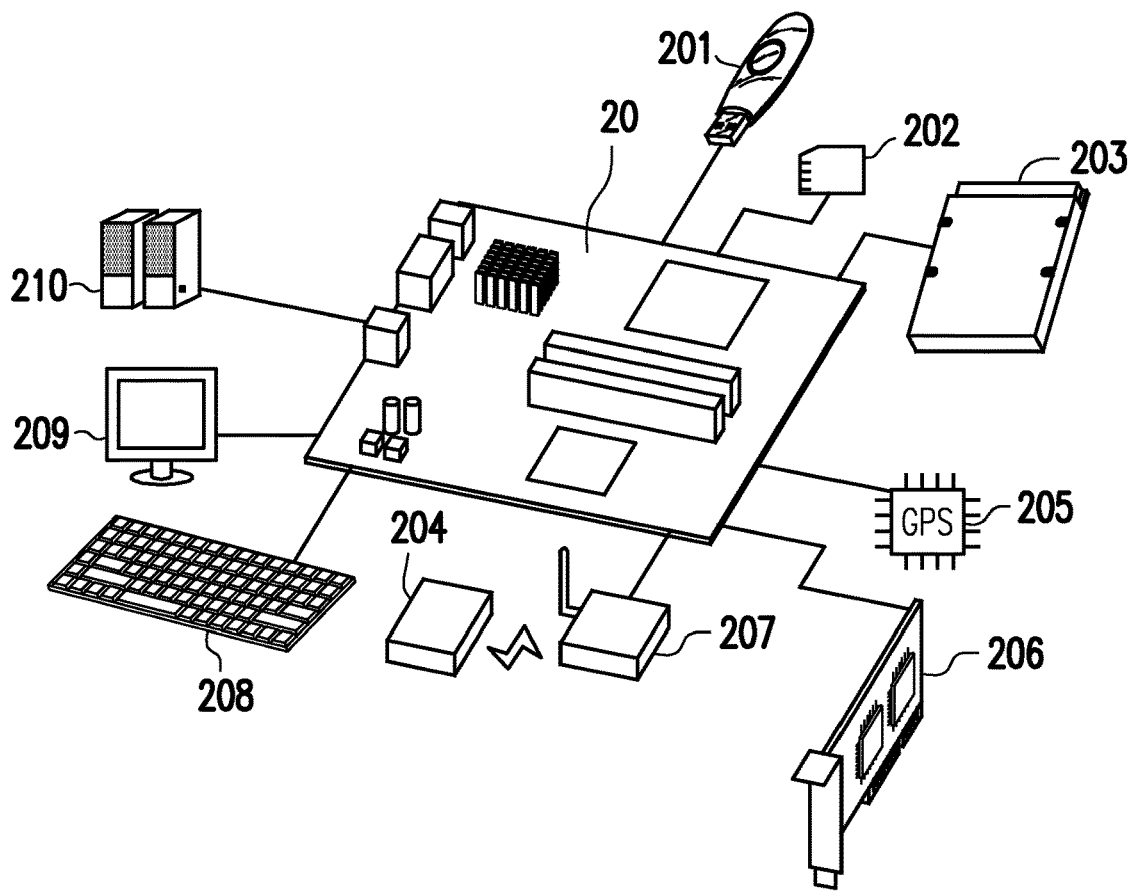
FIG. 2 is a schematic diagram illustrating a host system, a memory storage device and an I/O device according to another exemplary embodiment of the invention.

FIG. 1 is a schematic diagram illustrating a host system, a memory storage device and an I/O (input/output) device according to an exemplary embodiment of the invention. FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In this exemplary embodiment, the host system 11 is coupled to a memory storage device 10 through the data transmission interface 114. For example, the host system 11 can store data into the memory storage device 10 or read data from the memory storage device 10 via the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
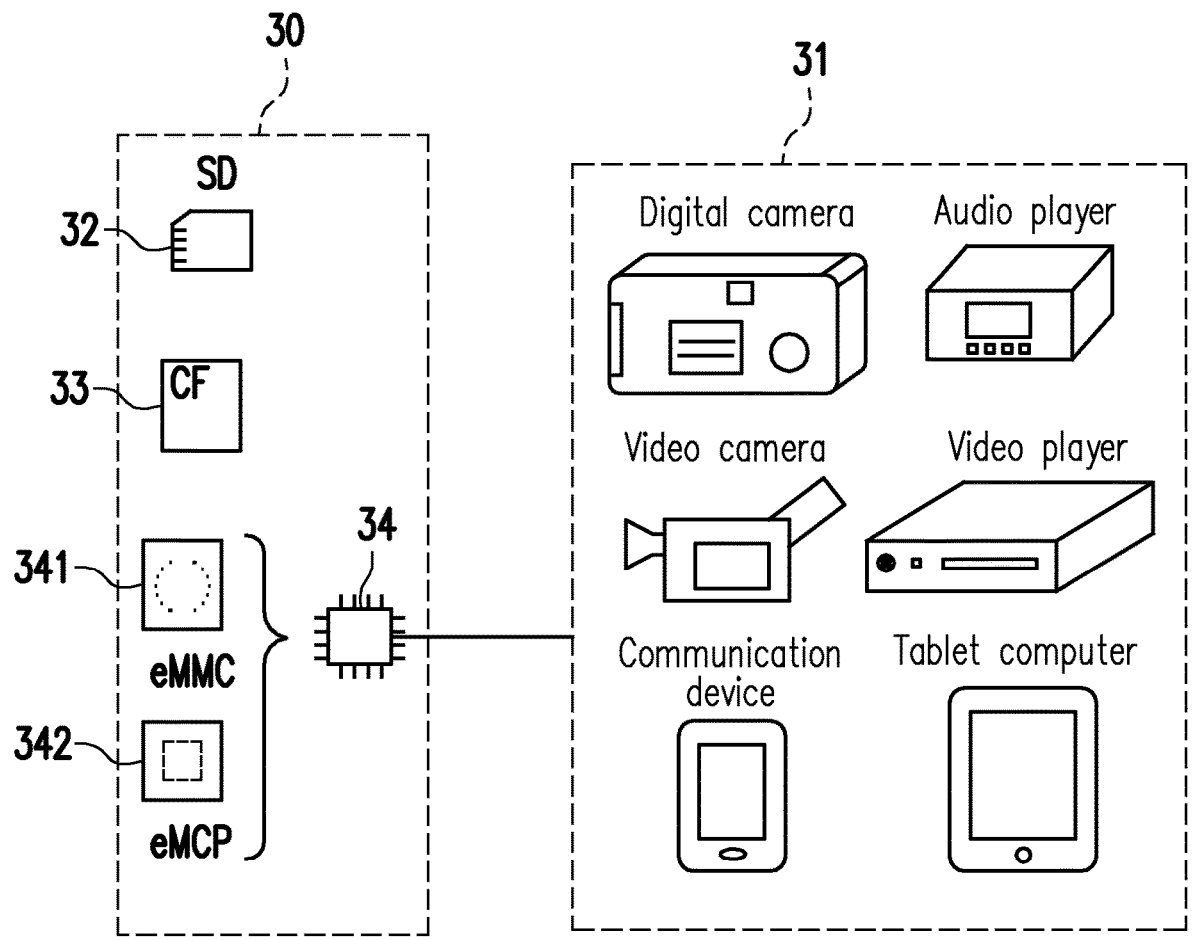
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the invention. Referring to FIG. 3, in another exemplary embodiment, a host system 31 may also be a system such as a digital camera, a video camera, a communication device, an audio player, a video player or a tablet computer, whereas a memory storage device 30 may be various non-volatile memory storage devices used by the host system, such as a SD (Secure Digital) card 32, a CF (Compact Flash) card 33 or an embedded storage device 34. The embedded storage device 34 includes various embedded storage devices capable of directly coupling a memory module onto a substrate of the host system, such as an eMMC (embedded Multi Media Card) 341 and/or an eMCP (embedded Multi Chip Package) storage device 342.

Figure 4:
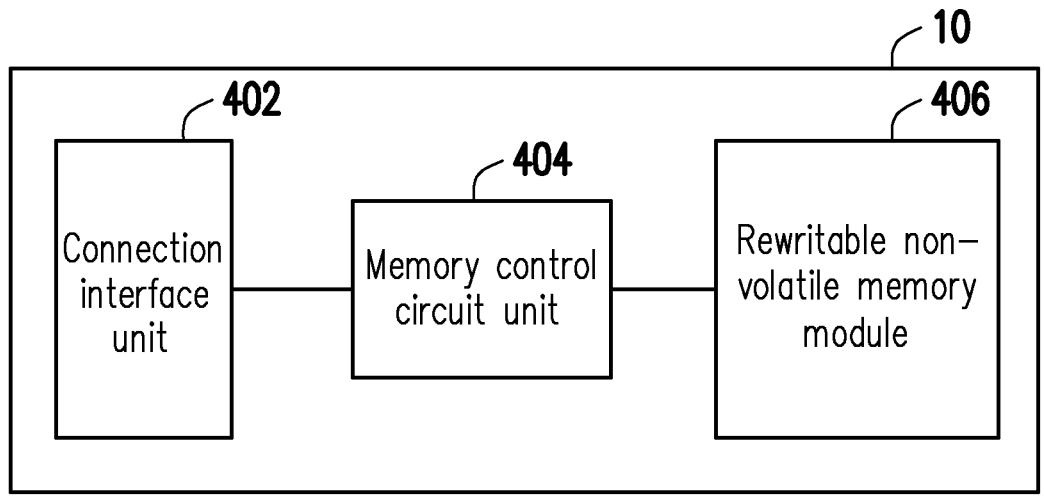
FIG. 4 is a schematic block diagram illustrating a memory storage device according to an exemplary embodiment of the invention.

FIG. 4 is a schematic block diagram illustrating a memory storage device according to an exemplary embodiment of the invention. Referring to FIG. 4, the memory storage device 10 includes a connection interface unit 402, a memory control circuit unit 404 and a rewritable non-volatile memory module 406.

The connection interface unit 402 is configured to couple to the memory storage device 10 to the host system 11. The memory storage device 10 can communicate with the host system 11 through the connection interface unit 402. In the present exemplary embodiment, the connection interface unit 402 is compatible with a SATA (Serial Advanced Technology Attachment) standard. Nevertheless, it should be understood that the invention is not limited in this regard. The connection interface unit 402 may also be compatible with a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a MCP interface standard, a MMC interface standard, an eMMC interface standard, a UFS (Universal Flash Storage) interface standard, an eMCP interface standard, a CF interface standard, an IDE (Integrated Device Electronics) interface standard or other suitable standards. The connection interface unit 402 and the memory control circuit unit 404 may be packaged into one chip, or the connection interface unit 402 is distributed outside of a chip containing the memory control circuit unit 404.

The memory control circuit unit 404 is configured to execute a plurality of logic gates or control commands which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), an MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), a QLC (Quad Level Cell) NAND-type flash memory module (i.e., a flash memory module capable of storing four bits in one memory cell), other flash memory modules or other memory modules having the same features.

In the rewritable non-volatile memory module 406, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage of the memory cell is also known as "writing data into the memory cell" or "programming the memory cell". With changes in the threshold voltage, each of the memory cells in the rewritable non-volatile memory module 406 has a plurality of storage states. The storage state to which the memory cell belongs may be determined by applying a read voltage to the memory cell, so as to obtain the one or more bits stored in the memory cell.

In this exemplary embodiment, the memory cells of the rewritable non-volatile memory module 406 may constitute a plurality of physical programming units, and the physical programming units can constitute a plurality of physical erasing units. Specifically, the memory cells on the same word line may constitute one or more of the physical programming units. If each of the memory cells can store two or more bits, the physical programming units on the same word line may be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is higher than a writing speed of the upper physical programming unit, and/or a reliability of the lower physical programming unit is higher than a reliability of the upper physical programming unit.

In this exemplary embodiment, the physical programming unit is the minimum unit for programming. That is, the physical programming unit is the minimum unit for writing data. For example, the physical programming unit may be a physical page or a physical sector. If the physical programming unit is the physical page, these physical programming units may include a data bit area and a redundancy bit area. The data bit area contains multiple physical sectors configured to store user data, and the redundant bit area is configured to store system data (e.g., management data such as an error correcting code, etc.). In this exemplary embodiment, the data bit area contains 32 physical sectors, and a size of each physical sector is 512 bytes (B). However, in other exemplary embodiments, the data bit area may also contain 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

Figure 5:
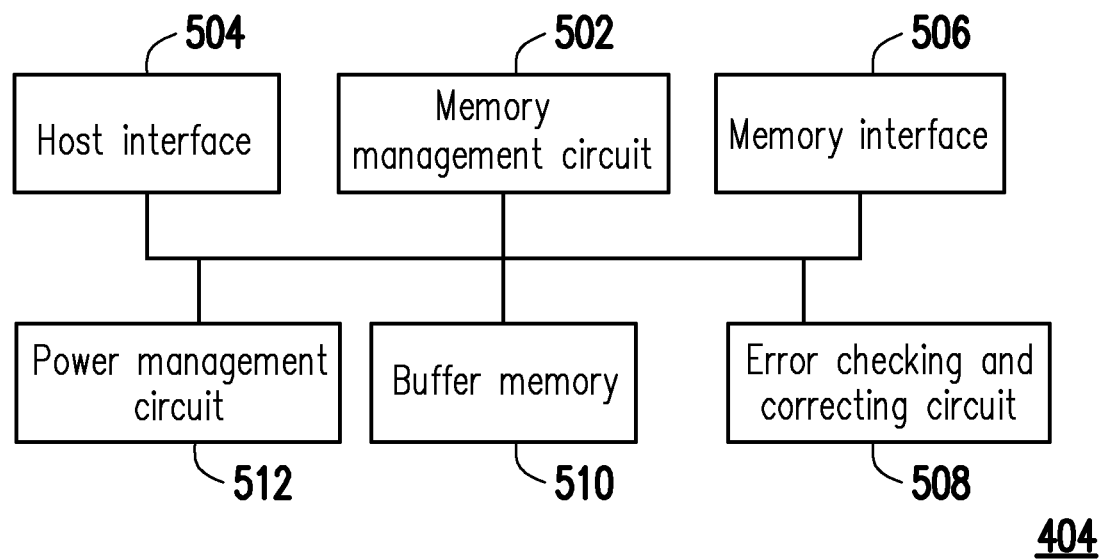
FIG. 5 is a schematic block diagram illustrating a memory control circuit unit according to an exemplary embodiment of the invention.

FIG. 5 is a schematic block diagram illustrating a memory control circuit unit according to an exemplary embodiment of the invention. Referring to FIG. 5, the memory control circuit unit 404 includes a memory management circuit 502, a host interface 504, a memory interface 506 and an error checking and correcting circuit 508.

The memory management circuit 502 is configured to control overall operations of the memory control circuit unit 404. Specifically, the memory management circuit 502 has a plurality of control commands. When the memory storage device 10 operates, the control commands are executed to perform various operations such as data writing, data reading and data erasing. Hereinafter, operations of the memory management circuit 502 are described as equivalent to operations of the memory control circuit unit 404.

In this exemplary embodiment, the control commands of the memory management circuit 502 are implemented in form of firmware. For instance, the memory management circuit 502 has a microprocessor unit (not illustrated) and a ROM (not illustrated), and the control commands are burned into the ROM. When the memory storage device 10 operates, the control commands are executed by the microprocessor to execute operations of writing, reading or erasing data.

In another exemplary embodiment, the control commands of the memory management circuit 502 may also be stored as program codes in a specific area (e.g., the system area in a memory exclusively used for storing system data) of the rewritable non-volatile memory module 406. In addition, the memory management circuit 502 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 406 to the RAM of the memory management circuit 502 when the memory control circuit unit 404 is enabled. Then, the control commands are executed by the microprocessor unit to execute operations, such as writing, reading or erasing data.

Further, in another exemplary embodiment, the control commands of the memory management circuit 502 may also be implemented in form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of a memory cell group of the rewritable non-volatile memory module 406. The memory writing circuit is configured to issue a write command sequence for the rewritable non-volatile memory module 406 to write data into the rewritable non-volatile memory module 406. The memory reading circuit is configured to issue a read command sequence for the rewritable non-volatile memory module 406 to read data from the rewritable non-volatile memory module 406. The memory erasing circuit is configured to issue an erase command sequence for the rewritable non-volatile memory module 406 to erase data from the rewritable non-volatile memory module 406. The data processing circuit is configured to process data to be written into the rewritable non-volatile memory module 406 and data read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing. In an exemplary embodiment, the memory management circuit 502 may further give command sequence of other types to the rewritable non-volatile memory module 406 for instructing to perform the corresponding operations.

The host interface 504 is coupled to the memory management circuit 502. The memory management circuit 502 can communicate with the host system 11 through the host interface 504. The host interface 504 may be used to receive and identify commands and data transmitted by the host system 11. For example, the commands and the data transmitted by the host system 11 may be transmitted to the memory management circuit 502 via the host interface 504. In addition, the memory management circuit 502 can transmit data to the host system 11 via the host interface 504. In this exemplary embodiment, the host interface 504 is compatible with the SATA standard. Nevertheless, it should be understood that the invention is not limited in this regard. The host interface 504 may also compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 506 is coupled to the memory management circuit 502 and configured to access the rewritable non-volatile memory module 406. In other words, data to be written into the rewritable non-volatile memory module 406 is converted into a format acceptable by the rewritable non-volatile memory module 406 via the memory interface 506. Specifically, if the memory management circuit 502 intends to access the rewritable non-volatile memory module 406, the memory interface 506 sends corresponding command sequences. For example, the command sequences may include the write command sequence as an instruction for writing data, the read command sequence as an instruction for reading data, the erase command sequence as an instruction for erasing data, and other corresponding command sequences as instructions for performing various memory operations (e.g., changing read voltage levels or performing a garbage collection procedure). These command sequences are generated by the memory management circuit 502 and transmitted to the rewritable non-volatile memory module 406 via the memory interface 506, for example. The command sequences may include one or more signals, or data transmitted in the bus. The signals or the data may include command codes and program codes. For example, information such as identification codes and memory addresses are included in the read command sequence;

The error checking and correcting circuit (a.k.a. a decoding circuit) 508 is coupled to the memory management circuit 502 and configured to execute an error checking and correcting operation to ensure the correctness of data. Specifically, when the memory management circuit 502 receives the writing command from the host system 11, the error checking and correcting circuit 508 generates an error correcting code (ECC) or an error detecting code (EDC) for data corresponding to the writing command, and the memory management circuit 502 writes data and the ECC or the EDC corresponding to the writing command to the rewritable non-volatile memory module 406. Then, when the memory management circuit 502 reads the data from the rewritable non-volatile memory module 406, the corresponding ECC and/or the EDC are also read, and the error checking and correcting circuit 508 executes the error checking and correcting operation on the read data based on the ECC and/or the EDC.

In an exemplary embodiment, the memory control circuit unit 404 further includes a buffer memory 510 and a power management circuit 512. The buffer memory 510 is coupled to the memory management circuit 502 and configured to temporarily store data and commands from the host system 11 or data from the rewritable non-volatile memory module 406. The power management unit 512 is coupled to the memory management circuit 502 and configured to control a power of the memory storage device 10.

In an exemplary embodiment, the rewritable non-volatile memory module 406 of FIG. 4 is also known as a flash memory module, and the memory control circuit unit 404 is also known as a flash memory controller for controlling the flash memory module. In an exemplary embodiment, the memory management circuit 502 of FIG. 5 is also known as a flash memory management circuit.

Figure 6:
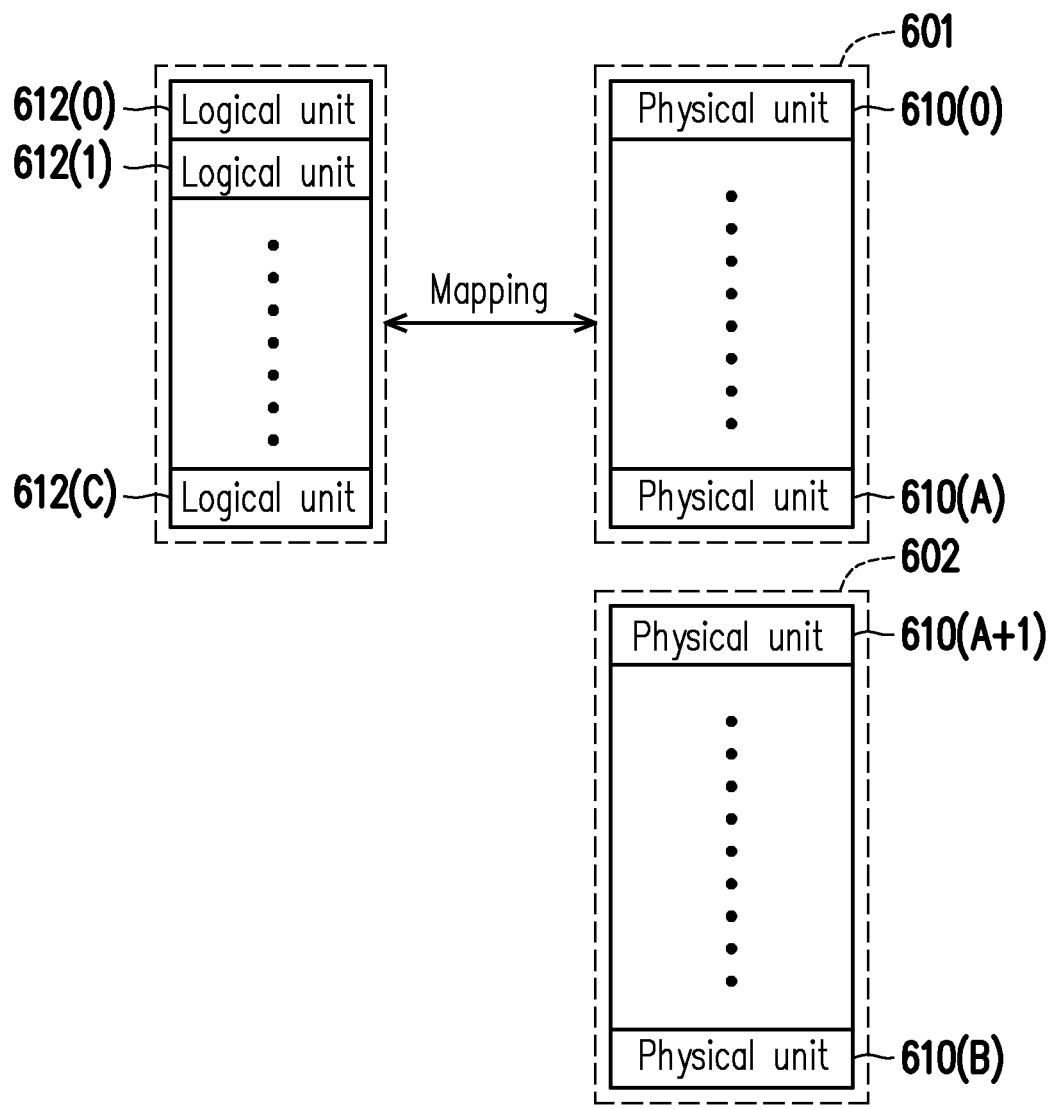
FIG. 6 is a schematic diagram illustrating management of a rewritable non-volatile memory module according to an exemplary embodiment of the invention.

FIG. 6 is a schematic diagram illustrating management of a rewritable non-volatile memory module according to an exemplary embodiment of the invention. Referring to FIG. 6, the memory management circuit 502 can logically group physical units 610(0) to 610(B) of the rewritable non-volatile memory module 406 into a storage area 601 and a replacement area 602. The physical units 610(0) to 610(A) in the storage area 601 are configured to store data, and the physical units 610(A+1) to 610(B) in the replacement area 602 are configured to replace damaged physical units in the storage area 601. For example, if data read from one specific physical unit includes too many errors and these errors cannot be corrected, the specific physical unit is regarded as a damaged physical unit. In addition, if there are no available physical erasing units in the replacement area 602, the memory management circuit 502 may declare the memory storage device 10 as in a write protect state so data can no longer be written thereto.

In the present exemplary embodiment, each physical unit refers to one physical programming unit. However, in another exemplary embodiment, one physical unit may also refer to one physical address, one physical erasing unit, or a composition of a plurality of continuous or discontinuous physical addresses. The memory management circuit 502 assigns logical units 612(0) to 612(C) for mapping to the physical units 610(0) to 610(A) in the storage area 601. In the present exemplary embodiment, each logical unit refers to one logical address. However, in another exemplary embodiment, each logical unit may also refer to one logical programming unit, one logical erasing unit or a composition of a plurality of continuous or discontinuous logical addresses. In addition, each of the logical units 612(0) to 612(C) may also be mapped to one or more physical units.

The memory management circuit 502 can record a mapping relation (a.k.a. a logical-physical address mapping relation) between the logical units and the physical units into at least one logical-physical address mapping table. When the host system 11 intends to read the data from the memory storage device 10 or write the data into the memory storage device 10, the memory management circuit 502 can perform a data accessing operation on the memory storage device 10 according to the logical-physical address mapping table.

After the memory storage device 10 of FIG. 1 is used for a period of time and/or when an ambient temperature changes greatly, the memory cells of the memory storage device 10 may age and/or wear. In response to aging and/or wearing of the memory cell, a shift of the threshold voltage of the memory cell may occur. The shift of the threshold voltage of the memory cell refers to a change in the threshold voltage of the memory cell, such as shifting from a specific voltage position to another voltage position. The shift of the threshold voltage of the memory cell may affect the accuracy of the data read from the memory cell. For example, it is assumed that the threshold voltage of a specific memory cell originally programmed is greater than a preset read voltage level. However, due to aging and/or wearing, the threshold voltage of the memory cell may shift to be less than the preset read voltage level. Therefore, if the preset read voltage level is used to read the memory cell, error bits may be read from the memory cell.

In an exemplary embodiment, the error checking and correcting circuit 508 can include one or more decoding circuits. The decoding circuit can be used to decode the data read from the rewritable non-volatile memory module 406. For example, the decoding circuit can try to correct a part or all of the error bits in the data read from the aging and/or wearing memory cell. For example, in an exemplary embodiment, the error checking and correcting circuit 508 can use a low-density parity-check code (LDPC code) to encode and decode data. However, in another exemplary embodiment, the error checking and correcting circuit 508 can also support a BCH code, a convolutional code, a turbo code, etc., which are not particularly limited in the invention. It should be noted that, in some cases, if the shift of the threshold voltage of the memory cell is too large, a decoding ability (e.g., the decoding success rate) and/or a decoding speed of the decoding circuit may decrease.

In an exemplary embodiment, after data is read from a specific physical unit of the rewritable non-volatile memory module 406, the error checking and correcting circuit 508 can decode the read data based on a specific decoding mode (a.k.a. a first decoding mode). After determining that the data cannot be successfully decoded in the first decoding mode, the error checking and correcting circuit 508 can decode the read data based on another decoding mode (a.k.a. a second decoding mode). In an exemplary embodiment, the first decoding mode is also known as a hard bit decoding mode or a retry mode, and the second decoding mode is also known as a soft bit decoding mode.

In the first decoding mode, the memory management circuit 502 can send at least one read command sequence to the rewritable non-volatile memory module 406. This read command sequence can instruct the rewritable non-volatile memory module 406 to read the memory cells in a specific physical unit (a.k.a. a first physical unit) by using a specific read voltage level (a.k.a. a hard decision voltage level). Then, the error checking and correcting circuit 508 can decode the read data. If the decoding is successful, successfully decoded data can be output. If the decoding is failed, the memory management circuit 502 can adjust the used read voltage level and instruct the rewritable non-volatile memory module 406 to reread the first physical unit by using the adjusted read voltage level. Then, the error checking and correcting circuit 508 can decode the read data again. The memory management circuit 502 and the error checking and correcting circuit 508 can repeat the above operation until the decoding is successful or a retry count reaches a preset value. For example, in the first decoding mode, each time the read voltage level is adjusted, the retry count can be updated (e.g., added by 1). If the retry count reaches a retry threshold value, the memory management circuit 502 can instruct the error checking and correcting circuit 508 to enter the second decoding mode. For example, assuming that the retry threshold value is currently 60, the retry count can be updated to 60 after reading the same physical unit by using 60 different read voltage levels. At the time, as the retry count is equal to the retry threshold value, the error checking and correcting circuit 508 enters the second decoding mode.

In the second decoding mode, the memory management circuit 502 can send at least one read command sequence to the rewritable non-volatile memory module 406. This read command sequence can instruct the rewritable non-volatile memory module 406 to read the memory cells in the first physical unit by using a plurality of read voltage levels (a.k.a. soft decision voltage levels). It should be noted that in the second decoding mode, the read voltage levels can be used to read one single memory cell to obtain a plurality of bits (a.k.a. verification bits). One of these verification bits is also known as a hard bit, and the remaining bits are also known as soft bits. For example, assuming that 5 read voltage levels are used to continuously read a specific memory cell to obtain 5 verification bits, the 5 verification bits may include 1 hard bit and 4 soft bits. In an exemplary embodiment, these 4 soft bits can also be reduced to 2 soft bits through logic operations. In addition, the invention is not limited to the number of read voltage levels used to read the specific memory cell in the second decoding mode, the number of the hard bits read from the specific memory cell and/or the number of the soft bits read from the specific memory cell. Then, the error checking and correcting circuit 508 can decode the read data.

It should be noted that in the second decoding mode, the memory management circuit 502 can update reliability information according to the soft bits. For example, compared with preset reliability information, the updated reliability information can be more in line with current aging and/or wearing state of the memory cell. According to the updated reliability information, the error checking and correcting circuit 508 has a higher probability of successfully decoding the read data.

In an exemplary embodiment, the reliability information can include a log likelihood ratio (LLR). The log likelihood ratio can reflect a probability that the data read from the specific memory cell is bit "0" and/or bit "1". In an exemplary embodiment, the reliability information can be obtained by looking up a table. For example, at least one reliability information table provided by the supplier of the memory module can be stored in the rewritable non-volatile memory module 406. The memory management circuit 502 can check the reliability information table according to the obtained soft bits to obtain the reliability information for decoding. In an exemplary embodiment, the reliability information can also be obtained by a real-time calculation. For example, the memory management circuit 502 can estimate a total of memory cells with the threshold voltage belonging to a specific voltage range according to the obtained soft bits. The memory management circuit 502 can dynamically calculate the reliability information corresponding to these memory cells according to the total. In an exemplary embodiment, the reliability information dynamically obtained according to the total can be more in line with the current aging and/or wearing state of the memory cell. In this way, the dynamically obtained reliability information can also be used to improve the decoding success rate of the error checking and correcting circuit 508.

Figure 7:
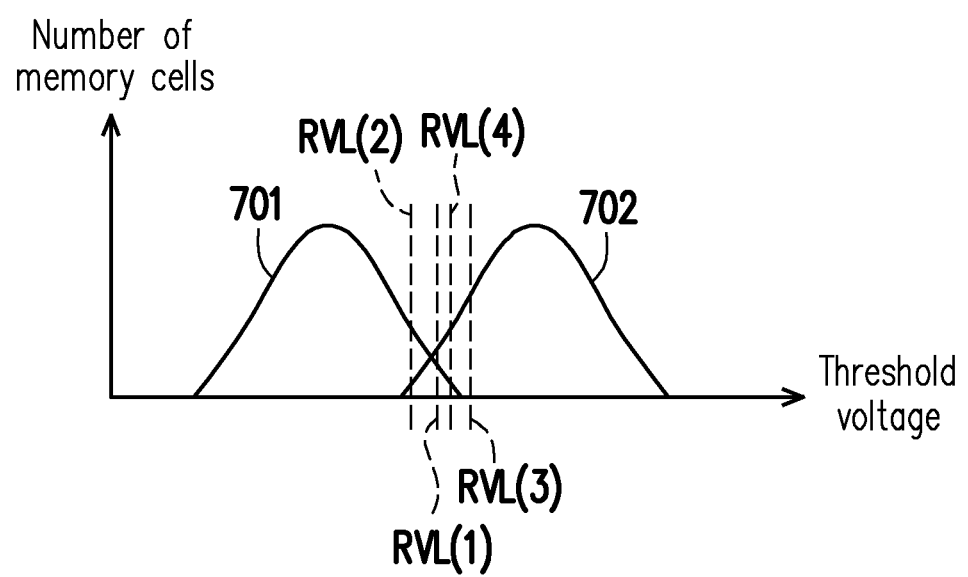
FIG. 7 is a schematic diagram illustrating different hard decision voltage levels used for reading a first physical unit in a first decoding mode according to an exemplary embodiment of the invention.

FIG. 7 is a schematic diagram illustrating different hard decision voltage levels used for reading a first physical unit in a first decoding mode according to an exemplary embodiment of the invention. Referring to FIG. 7, it is assumed that a threshold voltage distribution of the memory cells in the first physical unit includes states 701 and 702. The memory cells belonging to the state 701 are used to store one bit of data (e.g., the bit "0"), and the memory cells belonging to the state 702 are used to store another bit of data (e.g., the bit "1"). In addition, the memory cells belonging to the states 701 and/or 702 can also be used to store other bit data, which is not limited by the invention. In addition, the states 701 and 702 partially overlap. Therefore, when the memory cells are read by using certain read voltage levels, some memory cells that belong to state 701 will be determined wrongly as belonging to the state 702 and some memory cells that belong to state 702 will be determined wrongly as belonging to the state 701, and thus the error bits are generated in the read data accordingly.

In the first decoding mode, a read voltage level RVL(1) can first be used to read the memory cells in the first physical unit. The data read by using the read voltage level RVL(1) can be decoded. If the decoding is successful, the data can be output. If the decoding is failed, a next read voltage level RVL(2) may be used to read the memory cells in the first physical unit again. The data read by using the read voltage level RVL(2) can be decoded. If the decoding is successful, the data can be output. By analogy, read voltage levels RVL(3) and RVL(4) can be continuously used to read the memory cells in the first physical unit until the read data is successfully decoded or the retry count reaches the retry threshold value. It should be noted that, the read voltage levels RVL(1) to RVL(4) in FIG. 7 are merely an example, the total of the read voltage levels used in the first decoding mode and the voltage value of each read voltage level may be adjusted based on actual requirement, and the invention is not limited thereto.

Figure 8:
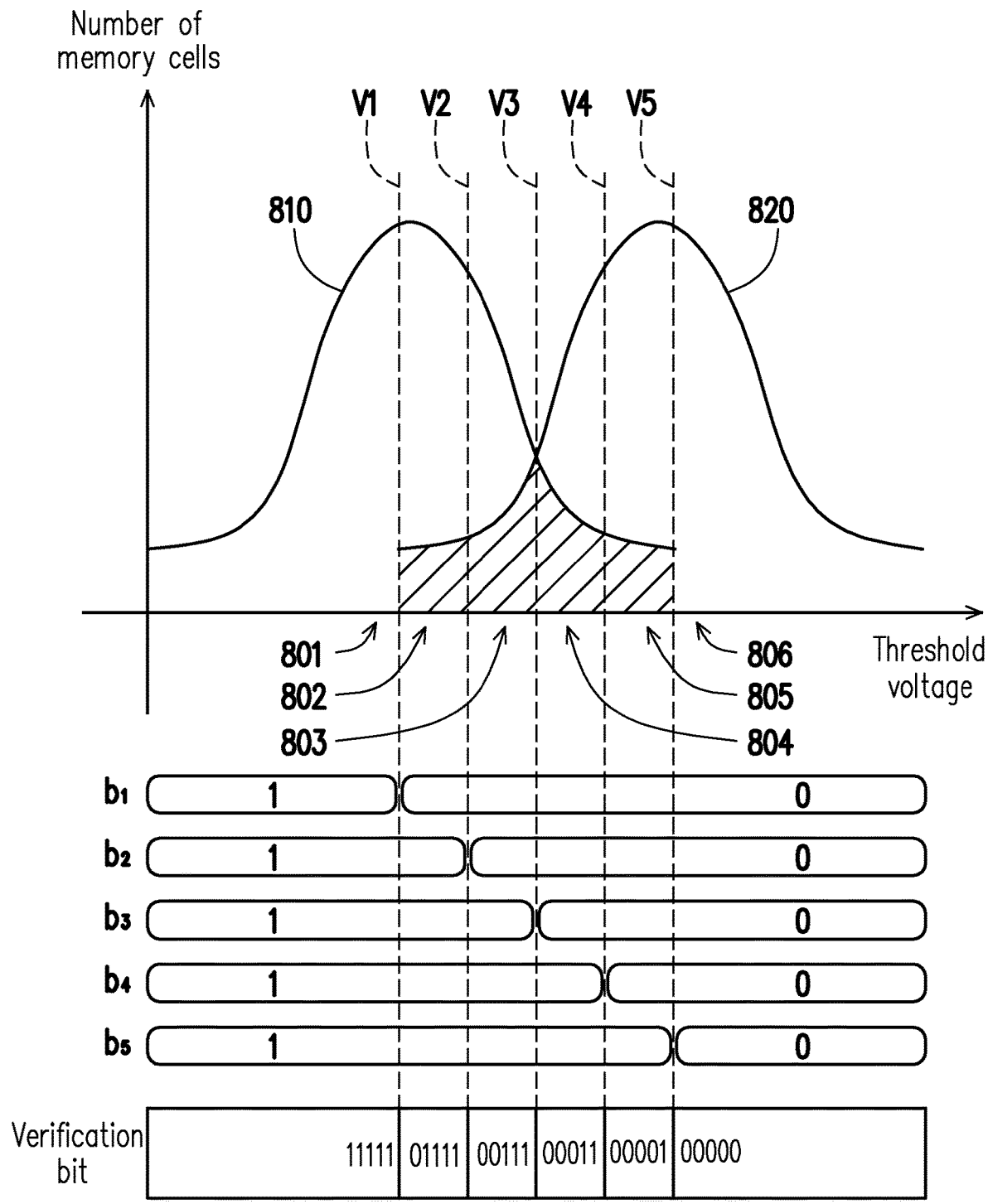
FIG. 8 is a schematic diagram illustrating different soft decision voltage levels used for reading the first physical unit in a second decoding mode according to an exemplary embodiment of the invention.

FIG. 8 is a schematic diagram illustrating different soft decision voltage levels used for reading the first physical unit in a second decoding mode according to an exemplary embodiment of the invention. Referring to FIG. 8, it is assumed that a threshold voltage distribution of the memory cells in the first physical unit includes states 810 and 820. In the second decoding mode, read voltage levels V1 to V5 may be used to read the memory cells in the first physical unit. As results of reading one specific memory cell in the physical unit by using the read voltage levels V1 to V5, verification bits b1 to b5 can be obtained. For examples, the read voltage levels V1 to V5 are configured to read the verification bits b1 to b5. According to a specific voltage range among voltage ranges 801 to 806 where the threshold voltage of one specific memory is located in, the verification bits obtained by reading the memory cell by using the read voltage levels V1 to V5 may be "11111", "01111", "00111", 00011, "00001" or "00000".

In an exemplary embodiment, if the read voltage level V3 is a plus-minus sign read voltage level, the verification bit b3 may be regarded as the hard bit, and the rest of the verification bits b1, b2, b4 and b5 may be regarded as the soft bits. According to the verification bits b1 to b5 obtained by reading one specific memory cell, the specific voltage range among the voltage ranges 801 to 806 where the threshold voltage of the memory cell is located may be determined. Meanwhile, the reliability information corresponding to the voltage range may be determined. The error checking and correcting circuit 508 can decode the data bit (i.e., the hard bit) read from the memory cell according to the reliability information.

It should be noted that, as shown by the exemplary embodiments of FIG. 7 and FIG. 8, information for decoding data in the second decoding mode (e.g., the soft bits) may be more than information for decoding in the first decoding mode. Accordingly, a decoding ability (or the decoding success rate) of the error checking and correcting circuit 508 for data in the second decoding mode is higher than a decoding ability of the error checking and correcting circuit 508 for data in the first decoding mode. In addition, a complexity of the decoding operation in the second decoding mode may be higher than a complexity of the decoding operation in the first decoding mode. Accordingly, a decoding speed of the error checking and correcting circuit 508 for data in the first decoding mode is higher than a decoding speed of the error checking and correcting circuit 508 for data in the second decoding mode.

In an exemplary embodiment, the memory management circuit 502 can determine (e.g., adjust or maintain) the retry threshold value according to decoding history information. The decoding history information includes information related to at least one decoding operation previously performed (a.k.a. a first decoding operation). For example, the decoding history information can reflect M decoding operations among past N decoding operations that achieve a successful decoding after rereading the first physical unit in the rewritable non-volatile memory module 406 P times. N, M and P are positive integers, and M is not greater than N. For example, if N is 10000, M is 2 and P is 4, the decoding history information can reflect 2 decoding operations among past 10000 decoding operations that achieve the successful decoding after rereading the first physical unit in the rewritable non-volatile memory module 406 4 times.

The values of N, M, and P can all include other positive integers, which are not limited by the invention. In addition, the decoding history information can also include more useful information. For example, among the past N decoding operations, the number of times the data was successfully decoded after entering the second decoding mode, the reliability information used by the successful decoding, and/or the read voltage level used by the successful decoding.

In an exemplary embodiment, a value of P can reflect a total of at least one data table referenced for adjusting a read voltage level (i.e., the hard decision voltage level) in the first decoding mode before data read from the first physical unit is successfully decoded. For example, it is assumed that 60 data tables are preset to be stored in the memory control circuit unit 404 or the rewritable non-volatile memory module 406. Each data table in the 60 data tables is recorded with a parameter for adjusting the read voltage level. When a specific decoding is failed in the first decoding mode, the memory management circuit 502 can refer to one of the 60 data tables to obtain the information recorded in the data table. The memory management circuit 502 can adjust the read voltage level according to this information and determine the read voltage level to be used next time. Therefore, in an exemplary embodiment, if P is 4, it means that, before the data read from the first physical unit is successfully decoded, the total of at least one data table referenced for adjusting the read voltage level (i.e., the hard decision voltage level) in the first decoding mode is 4.

Figure 9:
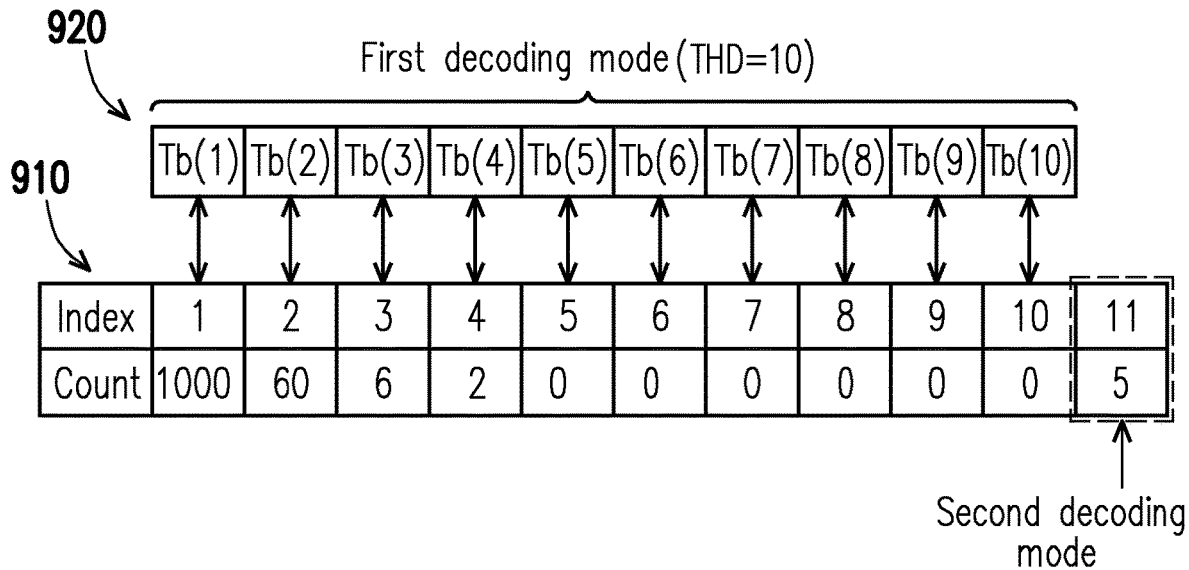
FIG. 9 is a schematic diagram illustrating decoding history information and data tables according to an exemplary embodiment of the invention.

FIG. 9 is a schematic diagram illustrating decoding history information and data tables according to an exemplary embodiment of the invention. Referring to FIG. 9, it is assumed that the decoding history information includes information 910 and a retry threshold value THD is currently 10. The information 910 can reflect that among the past 1073 decoding operations (N=1073), the number of the decoding operations that achieve the successful decoding after rereading the data in the first decoding mode only 1 time (P=1) is 1000 (M=1000); the number of the decoding operations that achieve the successful decoding after rereading the data in the first decoding mode 2 times (P=2) is 60 (M=60); the number of the decoding operations that achieve the successful decoding after rereading the data in the first decoding mode 3 times (P=3) is 6 (M=6); the number of the decoding operations that achieve the successful decoding after rereading the data in the first decoding mode 4 times (P=4) is 2 (M=2); the number of the decoding operations that achieve the successful decoding after rereading the data in the first decoding mode 5 to 10 times (P=5 to 10) is 0 (M=0); and the number of the decoding operations that achieve the successful decoding only after entering the second decoding mode is 5. The information 910 can be recorded and updated based on execution results of these past 1073 decoding operations.

It should be noted that a data table 920 includes tables Tb(1) to Tb(10). Each of the tables Tb(1) to Tb(10) is also known as a candidate data table. When the data in the first decoding mode is reread for the first time (P=1), the parameter in the table Tb(1) may be referenced to determine the read voltage level to be used (e.g., the read voltage level RVL(1) in FIG. 7). When the data in the first decoding mode is reread for the second time (P=2), the parameter in the table Tb(2) may be referenced to determine the read voltage level to be used (e.g., the read voltage level RVL(2) in FIG. 7). By analogy, when the data in the first decoding mode is reread for the third to tenth times (P=3 to 10), the parameters in the tables Tb(3) to Tb(10) may be sequentially referenced to determine the read voltage levels to be used. If the data tables Tb(1) to Tb(10) are all referenced and yet the data still cannot be successfully decoded in the first decoding mode, the second decoding mode may be entered so the more powerful decoding can be used to decode the data in the second decoding mode, as shown by FIG. 8.

In an exemplary embodiment, according to the information 910, in the past N decoding operations, the operations of using the tables Tb(5) to Tb(10) for adjusting the read voltage level to reread the data do not help much to improve the decoding success rate. Furthermore, the tables Tb(5) to Tb(10) used in the first decoding mode to adjust the read voltage level even only delay a time point of entering the second decoding mode, resulting in a longer decoding time.

In an exemplary embodiment, the memory management circuit 502 can adjust the retry threshold value THD according to the information 910. For example, the memory management circuit 502 can increase or decrease the retry threshold value THD according to a distribution status of count information (i.e., "Count" in the drawing) recorded in the information 910. In addition, corresponding to the adjustment of the retry threshold value THD, the memory management circuit 502 can also adjust a total of the candidate data tables available in the data table 920.

In an exemplary embodiment, the memory management circuit 502 can adjust the retry threshold value from a specific value (a.k.a. a first value) to another value (a.k.a. a second value). Here, the second value is less than the first value. Meanwhile, the memory management circuit 502 can remove Q data tables from the candidate data tables. Here, a value of Q corresponds to a difference between the first value and the second value. For example, assuming that the first value is 10 and the second value is 4 (i.e., the retry threshold value THD is decreased from 10 to 4), 6 data tables in the candidate data tables can be removed. It should be noted that the removed data tables mentioned here can refer to marking that data table as unavailable, rather than deleting that data table.

Figure 10:
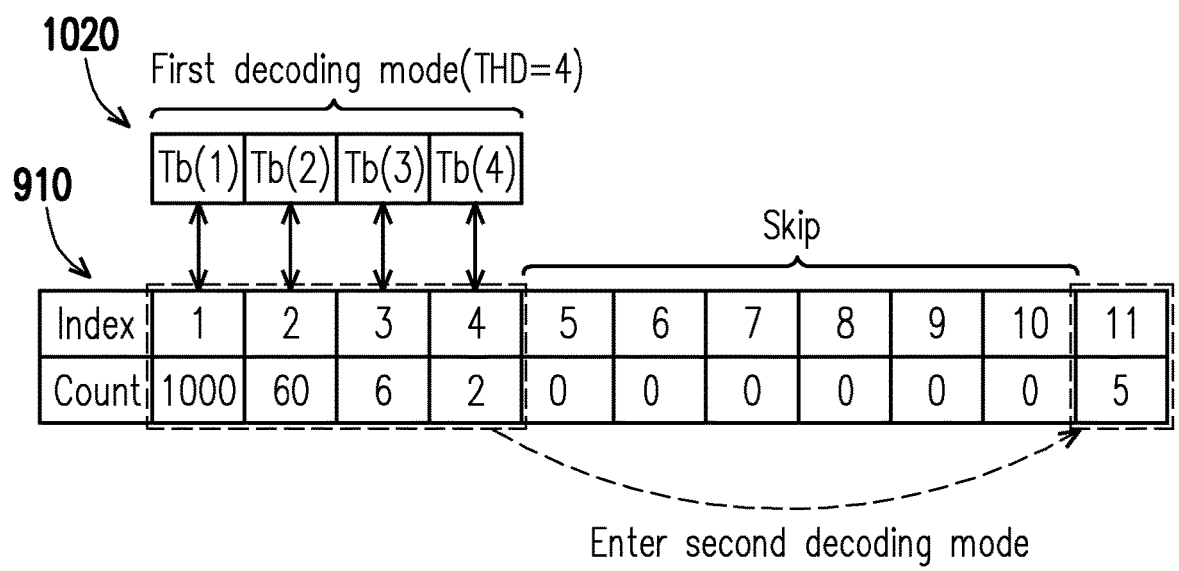
FIG. 10 is a schematic diagram illustrating an adjustment of a retry threshold value according to an exemplary embodiment of the invention.

FIG. 10 is a schematic diagram illustrating an adjustment of a retry threshold value according to an exemplary embodiment of the invention. Referring to FIG. 10, according to the information 910, in the past 1073 decoding operations, the number of the decoding operations that achieve the successful decoding after rereading and decoding the data in the first decoding mode 5 to 10 times (P=5 to 10) is 0. Therefore, the memory management circuit 502 can decrease the retry threshold value THD from the original 10 to 4 according to the information 910. Meanwhile, the memory management circuit 502 can remove the tables Tb(5) to Tb(10) from the data table 920 of FIG. 9.

After the retry threshold value THD is updated to 4, in the subsequent first decoding mode, if the decoding is still failed after 4 different read voltage levels (e.g., the read voltage levels RVL(1) to RVL(4)) are continuously used to read the first physical unit according to the tables Tb(1) to Tb(4) and sequentially decode the read data, in response to the retry count (i.e., 4) currently equal to the retry threshold value (i.e., 4), the memory management circuit 502 can instruct the error checking and correcting circuit 508 to directly enter the second decoding mode and decode the data in the first physical unit based on the second decoding mode.

Compared with the exemplary embodiment of FIG. 9, in the exemplary embodiment of FIG. 10, tables that do not significantly contribute to the decoding success rate of the first decoding mode (e.g., the tables Tb(5) to Tb(10)) can be removed. Accordingly, the time point of entering the second decoding mode can be advanced in the subsequent decoding operations. In some exemplary embodiments, when the error bits in the read data are relatively more, by advancing the time point of entering the second decoding mode, the decoding efficiency for this data can be effectively improved.

In an exemplary embodiment, the memory management circuit 502 can adjust the retry threshold value from a specific value (a.k.a. a third value) to another value (a.k.a. a fourth value). Here, the fourth value is greater than the third value. Meanwhile, the memory management circuit 502 can also add R data tables to the candidate data tables. Here, a value of R corresponds to a difference between the third value and the fourth value. For example, assuming that the third value is 4 and the fourth value is 5 (i.e., the retry threshold value THD is increased from 4 to 5), the memory management circuit 502 can add 1 data table to the candidate data tables so as to expand a total of data tables in the candidate data tables from 4 to 5.

Figure 11:
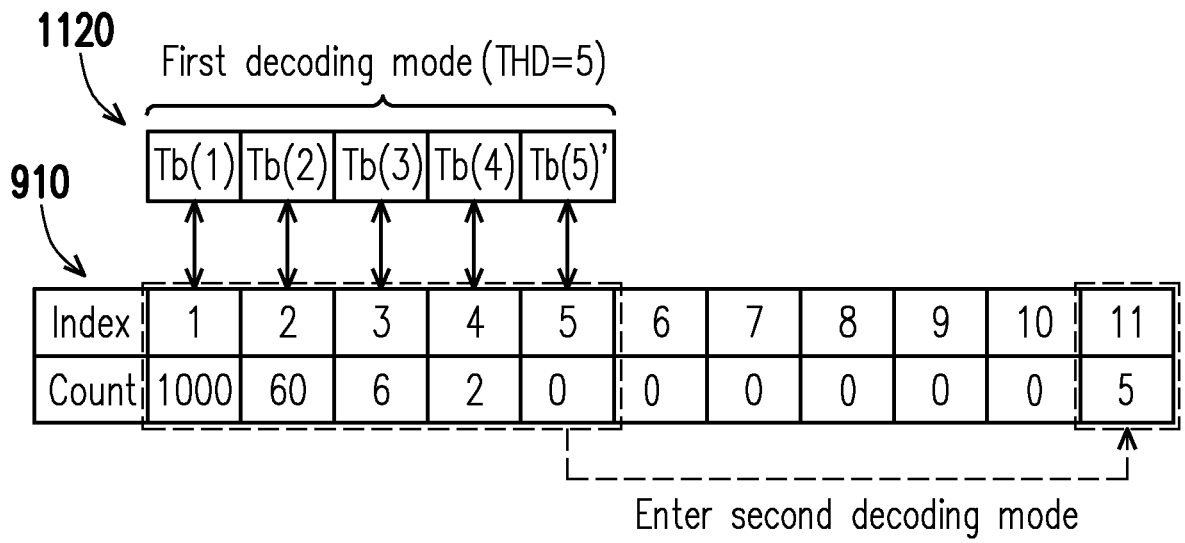
FIG. 11 is a schematic diagram illustrating an adjustment of a retry threshold value according to an exemplary embodiment of the invention.

FIG. 11 is a schematic diagram illustrating an adjustment of a retry threshold value according to an exemplary embodiment of the invention. Referring to FIG. 11, the memory management circuit 502 can increase the retry threshold value from 4 to 5. Meanwhile, the memory management circuit 502 can add a table Tb(5)' to a data table 1120 as a new candidate data table.

After the retry threshold value THD is updated to 5, in the subsequent first decoding mode, if the decoding is still failed after 5 different read voltage levels are continuously used to read the first physical unit according to the tables Tb(1) to Tb(4), and Tb(5)' and sequentially decode the read data, in response to the retry count (i.e., 5) currently equal to the retry threshold value (i.e., 5), the memory management circuit 502 can instruct the error checking and correcting circuit 508 to directly enter the second decoding mode and decode the data in the first physical unit based on the second decoding mode.

In an exemplary embodiment, the newly added table Tb(5)' in the data table 1120 may be the originally removed table Tb(5). That is, the content of the table Tb(5)' can be the same as the content of the table Tb(5). Alternatively, in an exemplary embodiment, the content of the table Tb(5)' may be different from the content of the table Tb(5).

In an exemplary embodiment, the memory management circuit 502 can determine contents of the R data tables according to information related to at least one successful decoding operation in the first decoding operation. For example, the memory management circuit 502 can determine the parameter for adjusting the read voltage level in the new candidate data table (e.g., the table Tb(5)' in FIG. 11) according to a specific read voltage level used in the successful decoding operation in the first decoding mode or the second decoding mode according to the decoding history information. Therefore, when the data is reread in the first decoding operation for the 5th time in the future, the memory management circuit 502 can refer to the parameter recorded in the table Tb(5)' to determine and use the read voltage level that has led to the successful decoding in the past, so as to improve the decoding success rate of the decoding operation performed in the first decoding operation.

In an exemplary embodiment, the memory management circuit 502 can also select a specific table from the removed tables (e.g., the tables Tb(5) to Tb(10) in FIG. 9) based on the decoding history information and add the specific table back to the data table 1120. The read voltage level used according to this specific table can be close to a specific read voltage level used in the successful decoding operation in the first decoding mode or the second decoding mode recorded in the decoding history information. In this way, the decoding success rate when using the newly added candidate data table for rereading and decoding in the future can also be improved.

It should be noted that in the subsequent operation of the system, the information 910 can also be updated simultaneously to reflect the decoding success rate under different retry times after applying the new retry threshold value and the new candidate data table. In addition, the updated information 910 can also be used to update the retry threshold value and the candidate data table again, which will not be repeated here.

It should be noted that, in the exemplary embodiments of FIG. 10 and FIG. 11, the number of the candidate data tables to be removed and added can be adjusted according to practical requirements, and the invention is not limited thereto. In addition, the total of the candidate data tables and the value of the retry threshold value used in the foregoing exemplary embodiments are also examples, and are not intended to limit the invention.

In an exemplary embodiment, after the retry threshold value is adjusted and the at least one decoding operation performed based on the first decoding mode (also known as (a.k.a.), a second decoding operation, a third decoding operation and/or a fourth decoding operation) is failed, the memory management circuit 502 can determine whether to enter the second decoding operation according to the retry threshold value. If an accumulated decoding count of the second decoding operation does not reach the retry threshold value, the memory management circuit 502 and the error checking and correcting circuit 508 do not enter the second decoding mode. Alternatively, if the accumulated decoding count of the second decoding operation reaches the retry threshold value, the memory management circuit 502 and the error checking and correcting circuit 508 can enter the second decoding mode. Here, the accumulated decoding count of the second decoding operation may be reflected by the retry count continuously updated in the first decoding operation. The relevant operation details have been described in detail above, and will not be repeated here.

Figure 12:
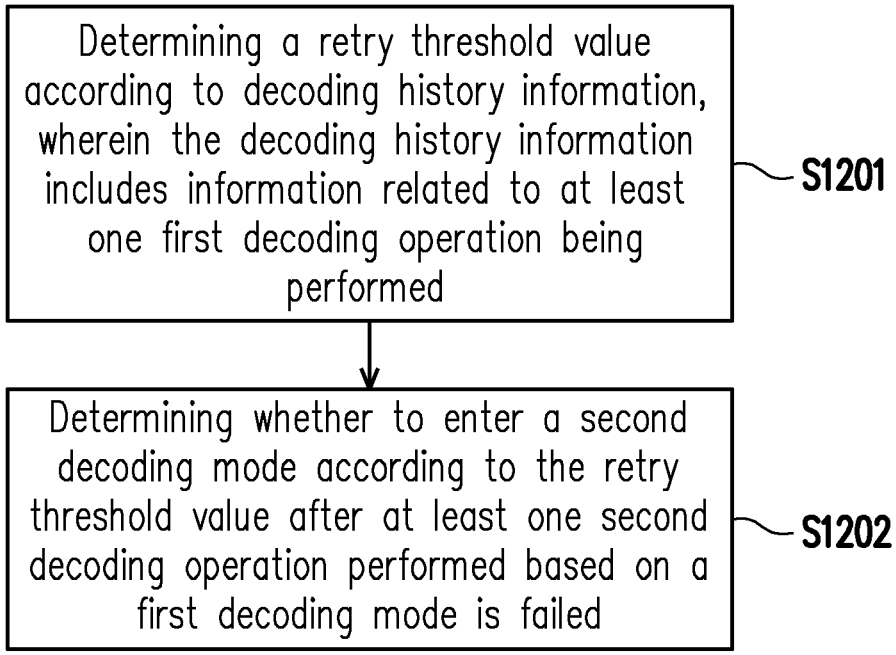
FIG. 12 is a flowchart illustrating a memory control method according to an exemplary embodiment of the invention.

FIG. 12 is a flowchart illustrating a memory control method according to an exemplary embodiment of the invention. Referring to FIG. 12, in step S1201, a retry threshold value is determined according to decoding history information, wherein the decoding history information includes information related to at least one first decoding operation previously performed. In step S1202, whether to enter a second decoding mode is determined according to the retry threshold value after at least one second decoding operation performed based on a first decoding mode is failed. A decoding ability of the second decoding mode is higher than a decoding ability of the first decoding mode.

Figure 13:
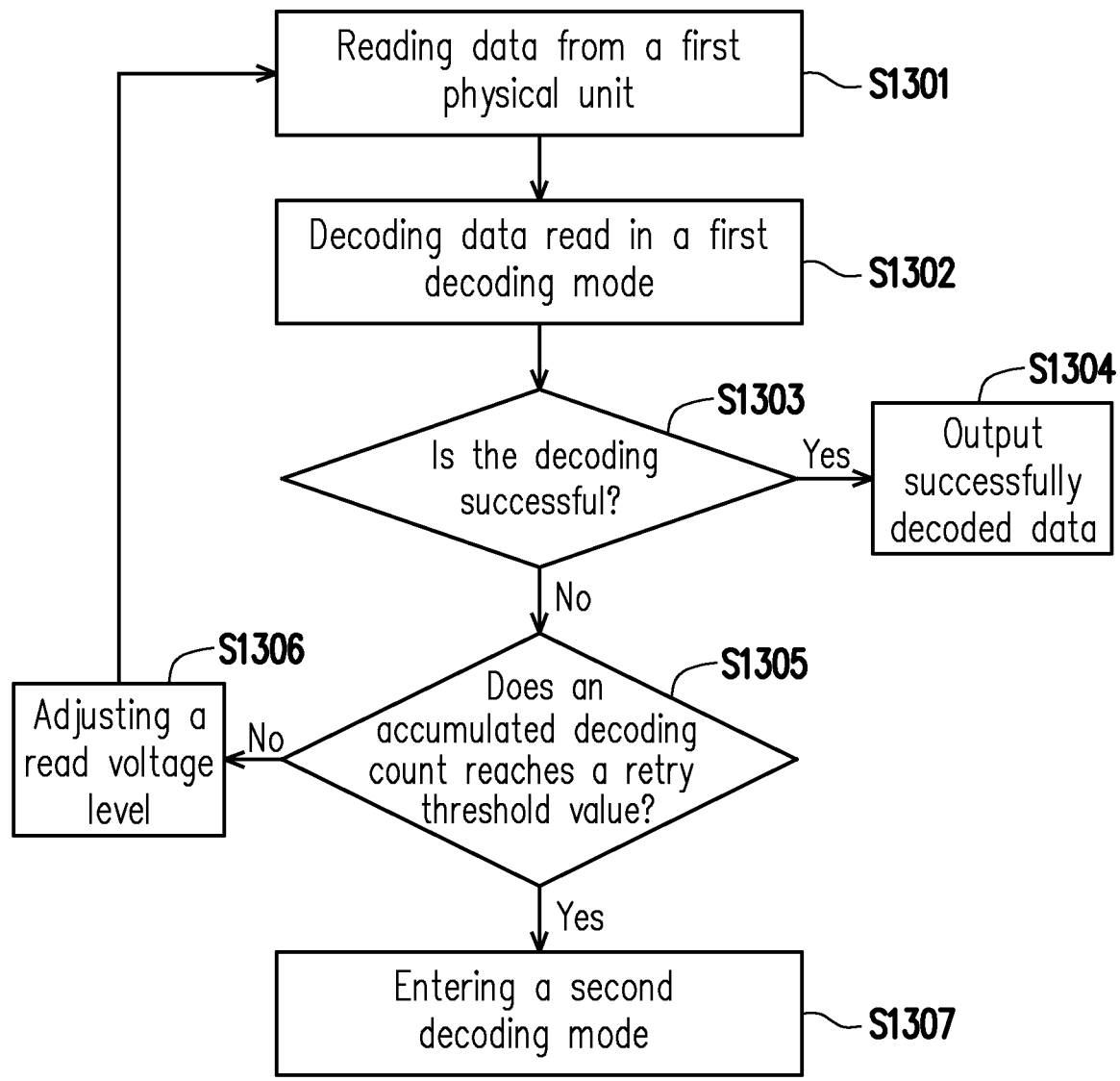
FIG. 13 is a flowchart illustrating a memory control method according to an exemplary embodiment of the invention.

FIG. 13 is a flowchart illustrating a memory control method according to an exemplary embodiment of the invention. Referring to FIG. 13, in step S1301, data is read from a first physical unit. In step S1302, data read in a first decoding mode is decoded. In step S1303, whether the decoding is successful is determined. If the decoding is successful, in step S1304, the successfully decoded data is outputted. If the decoding is not successful, in step S1305, whether an accumulated decoding count (i.e., the retry count) reaches a retry threshold value is determined. If the accumulated decoding count does not reach the retry threshold value, in step S1306, the read voltage level is adjusted. Then, the flow goes back to step 1306, in which the adjusted read voltage level is used to read the first physical unit again. In addition, if the accumulated decoding count reaches the retry threshold value, in step S1307, the second decoding mode is entered.

Nevertheless, each of steps depicted in FIG. 12 and FIG. 13 have been described in detail as above, thus related description thereof is not repeated hereinafter. It should be noted that, the steps depicted in FIG. 12 and FIG. 13 may be implemented as a plurality of program codes or circuits, which are not particularly limited in the invention. Moreover, the methods disclosed in FIG. 12 and FIG. 13 may be implemented with reference to above embodiments, or may be implemented separately, which are not particularly limited in the invention.

In summary, the retry threshold value can be dynamically adjusted according to the decoding history information. The decoding history information includes the information related to the at least one first decoding operation previously performed. In addition, corresponding to the adjustment of the retry threshold value, the total of the candidate data tables for adjusting the read voltage level to reread data in the first decoding mode can also be dynamically adjusted. For example, a data table with lower decoding success rate can be removed and/or a data table with higher decoding success rate can be added from/to the candidate data tables. Later, whether to enter the second decoding mode with higher decoding ability can be determined according to the retry threshold value after the at least one second decoding operation performed based on the first decoding mode is failed. In this way, in addition to improving the decoding success rate of the first decoding mode, the second decoding mode can be entered faster to decode the data with more error bits. As a result, the balance between the data decoding speed and the decoding success rate can be achieved.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

The previously described exemplary embodiments of the present invention have the advantages aforementioned, wherein the advantages aforementioned not required in all versions of the present invention.

It will be apparent to those skilled in the art that various modifications and variations can be made to the structure of the invention without departing from the scope or spirit of the invention. In view of the foregoing, it is intended that the present invention cover modifications and variations of this invention provided they fall within the scope of the following claims and their equivalents.

What is claimed is:

1. A memory control method for a rewritable non-volatile memory module, the memory control method comprising:
    adjusting a retry threshold value according to decoding history information, wherein the decoding history information comprises information related to at least one first decoding operation previously performed; and
    entering a second decoding mode after at least one second decoding operation performed based on a first decoding mode is failed and an accumulated decoding count of the at least one second decoding operation reaches the retry threshold value,
    wherein a decoding ability of the second decoding mode is higher than a decoding ability of the first decoding mode,
    the adjusting of the retry threshold value advances or delays a time point of the entering of the second decoding mode,
    the advancement of the time point comprises removing a first table from a data table, the first table includes a number of successful decoding operations after rereading and decoding data in the first decoding mode is 0, and
    the delay of the time point comprises adding a second table to the data table, the second table includes a number of successful decoding operations after rereading and decoding data in the first decoding mode is 0.

2. The memory control method of claim 1, wherein the decoding history information reflects M decoding operations among past N decoding operations that achieve a successful decoding after rereading a first physical unit in the rewritable non-volatile memory module P times; N, M and P are positive integers; and M is not greater than N.

3. The memory control method of claim 2, wherein a value of P further reflects a total of at least one data table referenced for adjusting a read voltage level in the first decoding mode before data read from the first physical unit is successfully decoded.

4. The memory control method of claim 1, wherein the step of adjusting the retry threshold value according to the decoding history information comprises:
    adjusting the retry threshold value from a first value to a second value, wherein the second value is less than the first value; and
    removing Q data tables from a plurality of candidate data tables, wherein a value of Q corresponds to a difference between the first value and the second value, and the candidate data tables are configured to adjust a read voltage level in the first decoding mode.

5. The memory control method of claim 1, wherein the step of adjusting the retry threshold value according to the decoding history information comprises:
    adjusting the retry threshold value from a third value to a fourth value, wherein the fourth value is greater than the third value; and
    adding R data tables to a plurality of candidate data tables, wherein a value of R corresponds to a difference between the third value and the fourth value, and the candidate data tables are configured to adjust a read voltage level in the first decoding mode.

6. The memory control method of claim 5, wherein the step of adjusting the retry threshold value according to the decoding history information further comprises:

determining contents of the R data tables according to information related to at least one successful decoding operation in the at least one first decoding operation.

7. The memory control method of claim 1, further comprising:
not entering the second decoding mode if the accumulated decoding count of the at least one second decoding operation does not reach the retry threshold value.

8. A memory storage device, comprising:
a connection interface circuit configured to couple to a host system; a rewritable non-volatile memory module; and
a memory control circuit unit, coupled to the connection interface circuit and the rewritable non-volatile memory module,
wherein the memory control circuit unit is configured to adjust a retry threshold value according to decoding history information, and the decoding history information comprises information related to at least one first decoding operation previously performed,
the memory control circuit unit is further configured to enter a second decoding mode after at least one second decoding operation performed based on a first decoding mode is failed and an accumulated decoding count of the at least one second decoding operation reaches the retry threshold value,
a decoding ability of the second decoding mode is higher than a decoding ability of the first decoding mode,
the adjusting of the retry threshold value advances or delays a time point of the entering of the second decoding mode,
the advancement of the time point comprises removing a first table from a data table, the first table includes a number of successful decoding operations after rereading and decoding data in the first decoding mode is 0, and
the delay of the time point comprises adding a second table to the data table, the second table includes a number of successful decoding operations after rereading and decoding data in the first decoding mode is 0.

9. The memory storage device of claim 8, wherein the decoding history information reflects M decoding operations among past N decoding operations that achieve a successful decoding after rereading a first physical unit in the rewritable non-volatile memory module P times; N, M and P are positive integers; and M is not greater than N.

10. The memory storage device of claim 9, wherein a value of P further reflects a total of at least one data table referenced for adjusting a read voltage level in the first decoding mode before data read from the first physical unit is successfully decoded.

11. The memory storage device of claim 8, wherein the operation of adjusting the retry threshold value according to the decoding history information comprises:
adjusting the retry threshold value from a first value to a second value, wherein the second value is less than the first value; and
removing Q data tables from a plurality of candidate data tables, wherein a value of Q corresponds to a difference between the first value and the second value, and the candidate data tables are configured to adjust a read voltage level in the first decoding mode.

12. The memory storage device of claim 8, wherein the operation of adjusting the retry threshold value according to the decoding history information comprises:
adjusting the retry threshold value from a third value to a fourth value, wherein the fourth value is greater than the third value; and
adding R data tables to a plurality of candidate data tables, wherein a value of R corresponds to a difference between the third value and the fourth value, and the candidate data tables are configured to adjust a read voltage level in the first decoding mode.

13. The memory storage device of claim 12, wherein the operation of adjusting the retry threshold value according to the decoding history information further comprises:
determining contents of the R data tables according to information related to at least one successful decoding operation in the at least one first decoding operation.

14. The memory storage device of claim 8, wherein the memory control circuit unit does not enter the second decoding mode if the accumulated decoding count of the at least one second decoding operation does not reach the retry threshold value.

15. A memory control circuit unit configured to control a memory storage device, wherein the memory storage device comprises a rewritable non-volatile memory module, and the memory storage device comprises:
a host interface circuit, configured to couple to a host system;
a memory interface circuit, configured to couple to the rewritable non-volatile memory module;
a decoding circuit; and
a memory management circuit, coupled to the host interface circuit, the memory interface circuit and the decoding circuit,
wherein the memory management circuit is configured to adjust a retry threshold value according to decoding history information, and the decoding history information comprises information related to at least one first decoding operation previously performed by the decoding circuit,
the memory management circuit is further configured to enter a second decoding mode after at least one second decoding operation performed based on a first decoding mode by the decoding circuit is failed and an accumulated decoding count of the at least one second decoding operation reaches the retry threshold value,
a decoding ability of the second decoding mode is higher than a decoding ability of the first decoding mode,
the adjusting of the retry threshold value advances or delays a time point of the entering of the second decoding mode,
the advancement of the time point comprises removing a first table from a data table, the first table includes a number of successful decoding operations after rereading and decoding data in the first decoding mode is 0, and
the delay of the time point comprises adding a second table to the data table, the second table includes a number of successful decoding operations after rereading and decoding data in the first decoding mode is 0.

16. The memory control circuit unit of claim 15, wherein the decoding history information reflects M decoding operations among past N decoding operations that achieve a successful decoding after rereading a first physical unit in the rewritable non-volatile memory module P times; N, M and P are positive integers; and M is not greater than N.

17. The memory control circuit unit of claim 16, wherein a value of P further reflects a total of at least one data table referenced for adjusting a read voltage level in the first decoding mode before data read from the first physical unit is successfully decoded.

18. The memory control circuit unit of claim 15, wherein the operation of adjusting the retry threshold value according to the decoding history information comprises:
adjusting the retry threshold value from a first value to a second value, wherein the second value is less than the first value; and
removing Q data tables from a plurality of candidate data tables, wherein a value of Q corresponds to a difference between the first value and the second value, and the candidate data tables are configured to adjust a read voltage level in the first decoding mode.

19. The memory control circuit unit of claim 15, wherein the operation of adjusting the retry threshold value according to the decoding history information comprises:
adjusting the retry threshold value from a third value to a fourth value, wherein the fourth value is greater than the third value; and
adding R data tables to a plurality of candidate data tables, wherein a value of R corresponds to a difference between the third value and the fourth value, and the candidate data tables are configured to adjust a read voltage level in the first decoding mode.

20. The memory control circuit unit of claim 19, wherein the operation of adjusting the retry threshold value according to the decoding history information further comprises:
determining contents of the R data tables according to information related to at least one successful decoding operation in the at least one first decoding operation.

21. The memory control circuit unit of claim 15, wherein the memory management circuit does not enter the second decoding mode if the accumulated decoding count of the at least one second decoding operation does not reach the retry threshold value.

22. A memory storage device, comprising:
a connection interface circuit configured to couple to a host system;
a rewritable non-volatile memory module; and
a memory control circuit unit, coupled to the connection interface circuit and the rewritable non-volatile memory module,
wherein the memory control circuit unit is configured to determine a retry threshold value as a first value,
the memory control circuit unit is further configured to adjust the retry threshold value from the first value to a second value,
the memory control circuit unit is further configured to enter a second decoding mode after at least one decoding operation performed based on a first decoding mode is failed and an accumulated decoding count of the at least one decoding operation reaches the retry threshold value which is one of the first value and the second value,
the first value is different from the second value,
a decoding ability of the second decoding mode is higher than a decoding ability of the first decoding mode,
the adjusting of the retry threshold value advances or delays a time point of the entering of the second decoding mode,
the advancement of the time point comprises removing a first table from a data table, the first table includes a number of successful decoding operations after rereading and decoding data in the first decoding mode is 0, and
the delay of the time point comprises adding a second table to the data table, the second table includes a number of successful decoding operations after rereading and decoding data in the first decoding mode is 0.

* * * * *